July 18, 1967 O. KLANK 3,332,020
TRANSISTER INPUT STAGE FOR A RECEIVER
Filed Dec. 23, 1964
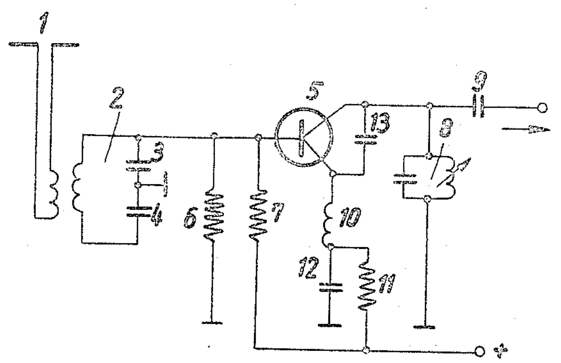
Inventor:
Otto Klank
By: Spencer & Kaye
Attorneys 3,332,020

TRANSISTOR INPUT STAGE FOR A RECEIVER

Otto Klank, Hannover, Germany, assignor to Telefunken Patentverwertungsgesellschaft G.m.b.H., Ulm (Danube), Germany Filed Dec. 23, 1964, Ser. No. 420,627
Claims priority, application Germany, Dec. 24, 1963, T 25,334
9 Claims. (Cl. 325—373)

The present invention relates to receivers and more particularly to radio receivers with transistor input stages.

In broadcast reception with transistor radio receivers it is observed, at places where several transmitters provide large field strengths, that the strongest transmitters may be received at several points of the waveband where they should not be received a all, particularly in the VHF band. This is attributed to the formation of combination frequencies, such combinations including the harmonics of the received transmitter frequencies, in the first transistor stages of the receiver. The reason for the formation of combination frequencies is that the approximately linear modulation range of a transistor is very much less than that of a vacuum tube.

According to the present invention, a radio frequency amplifier stage for a radio receiver is provided, comprising, a transistor connected in common emitter configuration, with connections for applying the input signal between the base of the transistor and a point at ground potential, and, connected in a path between the emitter and that point, an inductor whose value is chosen sufficiently large so that the amplitude of interference combination frequencies which would otherwise be produced in the transistor is substantially reduced, but not so large as to reduce the power amplification of the stage to a point where the signal-noise ratio of the receiver is no longer determined mainly by the signal-noise ratio of the stage.

The effect of the inductor is to provide negative current feedback in the first transistor stage of the receiver, which has the effect of reducing the voltage of received signals appearing at the input of the transistor effectively independently of frequency, and also of linearizing the characteristic curve that is, the collector current as a function of base current of the transistor. Moreover, the inductor does not, as would an un-bypassed resistor in the emitter circuit, cause additional noise. The invention is based on the consideration that an inductor connected in the emitter lead of a transistor which has a much greater inductance than that of said lead has such a favorable effect in reducing the aforementioned difficulties that the drawback of the reduction in amplification of the input stage can be accepted.

According to a further feature of the invention, the amplifier is provided with a neutralizing circuit which tends to cancel the effect on the gain of the stage of the collector-base capacitance, which causes negative feedback.

It is therefore an object of the present invention to provide a transistorized input stage for radio receivers which overcome these difficulties.

It is a further object of the present invention to provide a transistor input stage for radio receivers, which stage includes an inductor for providing negative current feedback.

Additional objects and advantages of the present invention will become apparent upon consideration of the following description when taken in conjunction with the accompanying drawings in which the single figure is a schematic of a transistor input stage for a VHF receiver according to the invention.

Referring now to the figure, a dipole aerial 1 is strongly coupled to the input oscillatory circuit 2, and in order to obtain optimum matching to the transistor 5, this oscillatory circuit is coupled by the capacitative voltage divides 3, 4 to the base of the transistor. A predetermined bias voltage is applied to the base of the transistor by a voltage divider constituted by the resistors 6, 7. A tunable oscillatory circuit 8 is connected to the collector of said transistor. In order to simplify the receiver the input oscillatory circuit 2 is permanently tuned to a frequency in the middle of the VHF band, that is aproximately 95 mcs., a feature which makes the use of devices for reducing the effects of interfering frequencies especially important. The output of the transistor stage is coupled through the capacitor 9 to the following stage of the receiver (not shown), which may be, for example, a mixer stage.

An inductor 10 is provided in the emitter circuit of the transistor in accordance with the present invention. It is important that the value of the inductance be correctly chosen. If the inductance is too small, for example having a reactance (or inductive impedance) less than approximately 50 ohms at a frequency of 95 megacycles (mcs.) when a high frequency transistor of the type designated as AF 102 or AF 106 is used, the desired effect is too small; on the other hand if the inductance is too large, for example having a reactance greater than 120 ohms under the above conditions, then pronounced noise occurs, because due to the overly reduced amplification of the first stage the noise in the next stage is added to that of the first stage.

A resistor 11 is also provided in the emitter circuit to establish the operating point of the transistor, in the well-known manner, and it is by-passed for alternating current by the capacitor 12.

A considerable improvement in the first transistor stage is obtained, according to the above-mentioned further feature of the invention, if a capacitor is connected between the collector and emitter of such design value that the positive feedback it produces cancels out wholly or partially (that is, neutralizes) or predominates over the negative feedback due to the collector-base capacitance of the transistor.

The capacitor 13 connected between collector and emitter of the transistor serves to reduce, compensate, or overcompensate for the effects of the negative feedback due to the collector-base capacitance, and may have, for example, a value of 1 picofarad. The capacitor 13 has a further effect in addition to the operation already described. Due to the reduction in the negative voltage feedback the internal resistance of the transistor 5 is increased, so that damping of the oscillatory circuit 8 is reduced. This means that the selectivity of the oscillatory circuit is increased so that fewer interference frequencies are able to reach the following stage; therefore, combination frequency formation is avoided in those stages also. This effect may be aided if the coupling capacitor 9 is designed to have a smaller capacitance value, since then the input resistance of the following stage has less damping effect on the oscillatory circuit 8. It is possible to reduce the value of capacitor 9 because the amplification of the first stage has been increased by the addition of capacitor 13.

By the reduction or elimination of negative feedback, the amplification of the first stage is increased. This is advantageous not only because of the increased amplification itself, but because the signal-noise ratio of the receiver is increased, since the noise of the first stage is raised above that of the following stage so that the latter accordingly exerts less influence. This result may appear surprising at first because it has been stated above that a reduction of amplification of the first stage by the negative feedback produced by the inductor in the emitter line could be accepted. However, the negative current feedback due to the inductor in the emitter lead is broad-band—that is, practically uniform over the frequency band—while the negative feedback through the collector-base capacitance is a voltage negative feedback which depends on the alternating voltage at the collector. Since this alternating voltage is determined by an oscillatory circuit tunable to the respective received frequency at the collector, the negative voltage feedback is applied only in accordance with the resonance curve of this oscillatory circuit; that is, for the most part only at the desired receiving frequency and frequencies close thereto. It is this situation that is undesirable since on receiving a desired transmitter it is preferable that the interfering frequencies be weakened, but not the desired frequency. By virtue of the reduction or elimination of the unwanted narrowband negative voltage feedback, or even by introducing a narrowband positive feedback, amplification becomes correspondingly greater. This means that, if desired, the broad-band negative feedback (from the inductance) can be increased, allowing a further attenuation of the unwanted received frequencies.

Experiments have shown that a transistor stage incorporating the features of the invention has a performance comparable to that of a conventional vacuum tube stage when voltages of up to 100 mv. are received at the aerial.

It will be understood that the above description of the present invention is susceptible to various modifications, changes, and adaptations, and the same are intended to be comprehended within the meaning and range of equivalents of the appended claims.

What is claimed is:

1. A radio frequency amplifier first stage for a radio receiver, said stage having but a single output and comprising, in combination:

a transistor having emitter, base, and collector terminals and connected in grounded emitter configuration with said collector terminal connected to said single output;

means for applying input signals between said base terminal and ground; and inductive means connected between said emitter terminal and ground, said inductive means having no ductive coupling to the collector terminal and having a value large enough to constitute a means for substantially reducing the amplitude of interfering combination frequencies, and yet small enough to constitute means for maintaining the power amplification of said stage at a level whereat the signal-noise ratio of such receiver is determined primarily by the signal-noise ratio of said stage.

2. A radio frequency amplifier stage as defined in claim 1, including neutralizing circuit means connected between said collector and emitter terminals for substantially cancelling the effect on the gain of said stage of the negative feedback caused by the collector-base capacitance.

3. A radio frequency amplifier stage as defined in claim 2, wherein said neutralizing circuit means consists of capacitative means.

4. A radio frequency amplifier stage as defined in claim 2, including tuned circuit means connected between said collector terminal and ground, said tuned circuit means being tunable to the frequency of a transmission which it is desired to receive.

5. An input stage for a radio receiver as defined in claim 1, said input stage including input oscillatory circuit means tuned to a frequency near the middle of the frequency band to be received, and output oscillatory circuit means tunable to the frequency of the transmission which it is desired to receive.

6. A radio frequency amplifier stage as defined in claim 1 for receiving a range of frequencies including 95 megacycles, wherein said inductive means, at 95 megacycles, has an inductive impedance between approximately 50 and 120 ohms.

7. An input stage for a radio receiver, said stage having but a single output and comprising, in combination:

a transistor, including an input terminal, an output terminal connected to said single output, and a third terminal; and inductive means connected between said third terminal and a point at ground potential and having no inductive coupling to the output terminal for increasing the length of the linear portion of the characteristic curve of said transistor.

8. A radio frequency amplifier stage as defined in claim 7, wherein the value of said inductive means is large enough to substantially reduce formation of interfering combination frequencies within the transistor, and yet small enough so that the gain of said stage gives it a signal-noise ratio which substantially determines the signal-noise ratio of such receiver.

9. An arrangement as defined in claim 7 further comprising antenna means connected to said input terminal.

References Cited

UNITED STATES PATENTS

| | | | |
|---|---|---|---|
| 2,978,578 | 4/1961 | Waring | 325—318 X |
| 3,154,750 | 10/1964 | David et al. | 330—31 X |
| 3,160,824 | 12/1964 | Stair | 330—31 X |

FOREIGN PATENTS

| | | |
|---|---|---|
| 824,811 | 12/1959 | Great Britain. |

OTHER REFERENCES

Electronics, p. 68, Dec. 6, 1963.

Stern et al.: Transistor AM Broadcast Receiver, I.R.E. Convention Record, pp. 8–14, Rec'd in Patent Office July 7, 1954.

Zeitschrift "Funkschau" Band 35, Heft 9, Seiten 245–248 (May 1963).

KATHLEEN H. CLAFFY, *Primary Examiner.*

ROY LAKE, *Examiner.*

F. D. PARIS, R. S. BELL, *Assistant Examiners.*